(12) United States Patent
Yang et al.

(10) Patent No.: US 8,305,276 B2
(45) Date of Patent: Nov. 6, 2012

(54) TESTING CIRCUIT BOARD

(75) Inventors: Ying Yang, Shenzhen (CN); Yan-Feng Yang, Shenzhen (CN); Ling-Yu Huang, Shenzhen (CN); Long-Yong Liu, Shenzhen (CN); Guo-Min Luo, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 461 days.

(21) Appl. No.: 12/755,480

(22) Filed: Apr. 7, 2010

(65) Prior Publication Data
US 2011/0140974 A1 Jun. 16, 2011

(30) Foreign Application Priority Data
Dec. 16, 2009 (CN) .......................... 2009 1 0311630

(51) Int. Cl.
*G01R 29/10* (2006.01)
(52) U.S. Cl. .................... 343/703; 343/841; 324/754

(58) Field of Classification Search ................. 343/703, 343/841; 324/754, 761
See application file for complete search history.

(56) References Cited

U.S. PATENT DOCUMENTS

| | | | |
|---|---|---|---|
| 6,229,490 B1 * | 5/2001 | Hofmann | 343/702 |
| 7,764,246 B2 * | 7/2010 | Yu et al. | 343/841 |
| 2004/0263189 A1 * | 12/2004 | Perry | 324/754 |
| 2006/0139217 A1 * | 6/2006 | Vance | 343/702 |
| 2010/0295569 A1 * | 11/2010 | Chu et al. | 324/754 |

* cited by examiner

*Primary Examiner* — Tho G Phan
(74) *Attorney, Agent, or Firm* — Altis Law Group, Inc.

(57) ABSTRACT

An exemplary testing circuit board is used for testing an antenna performance and includes a signal circuit layer, a base layer electrically connected to the signal circuit layer, and a test unit. The signal circuit layer can transmit test signals from the antenna. The base layer is fixed with the signal circuit layer and used as a ground section to shield the test signals. The test unit is electrically connected to the signal circuit layer and the base layer and includes a signal inception port. The signal inception port is positioned on the signal circuit layer and protrudes from the base layer, and the signal inception port is capable of receiving the test signals and transmitting the test signals to the signal circuit layer.

20 Claims, 6 Drawing Sheets

TESTING CIRCUIT BOARD

BACKGROUND

1. Technical Field

The disclosure generally relates to testing circuit boards, more particularly, to a testing circuit board used for testing antenna performance of an electronic device.

2. Description of the Related Art

Antennas are widely used in mobile phones, personal digital assistants (PDAs) and other electronic devices. To meet the high-quality communication requirements of the electronic devices, it is important to test the antenna performance during the production stage. While testing the antenna, the antenna is electrically connected to different test probes on a signal testing circuit board to simulate a working environment of the antenna. The antenna then receives a radio signal as a test signal from the signal testing circuit board and the test signal is sent to a signal receiver; the signal receiver transmits the test signal to a signal analyzer, accordingly to obtain performance parameters of the antenna.

However, in practical use, the test signal transmitted by the signal testing circuit board are vulnerable to interference and cannot meet the testing needs due to, e.g., signal attenuation, poor signal waveform, and frequency drift.

Therefore, there is room for improvement within the art.

BRIEF DESCRIPTION OF THE DRAWINGS

Many aspects of a testing circuit board can be better understood with reference to the following drawings. The components in the drawings are not necessarily drawn to scale, the emphasis instead being placed upon clearly illustrating the principles of the exemplary testing circuit board. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
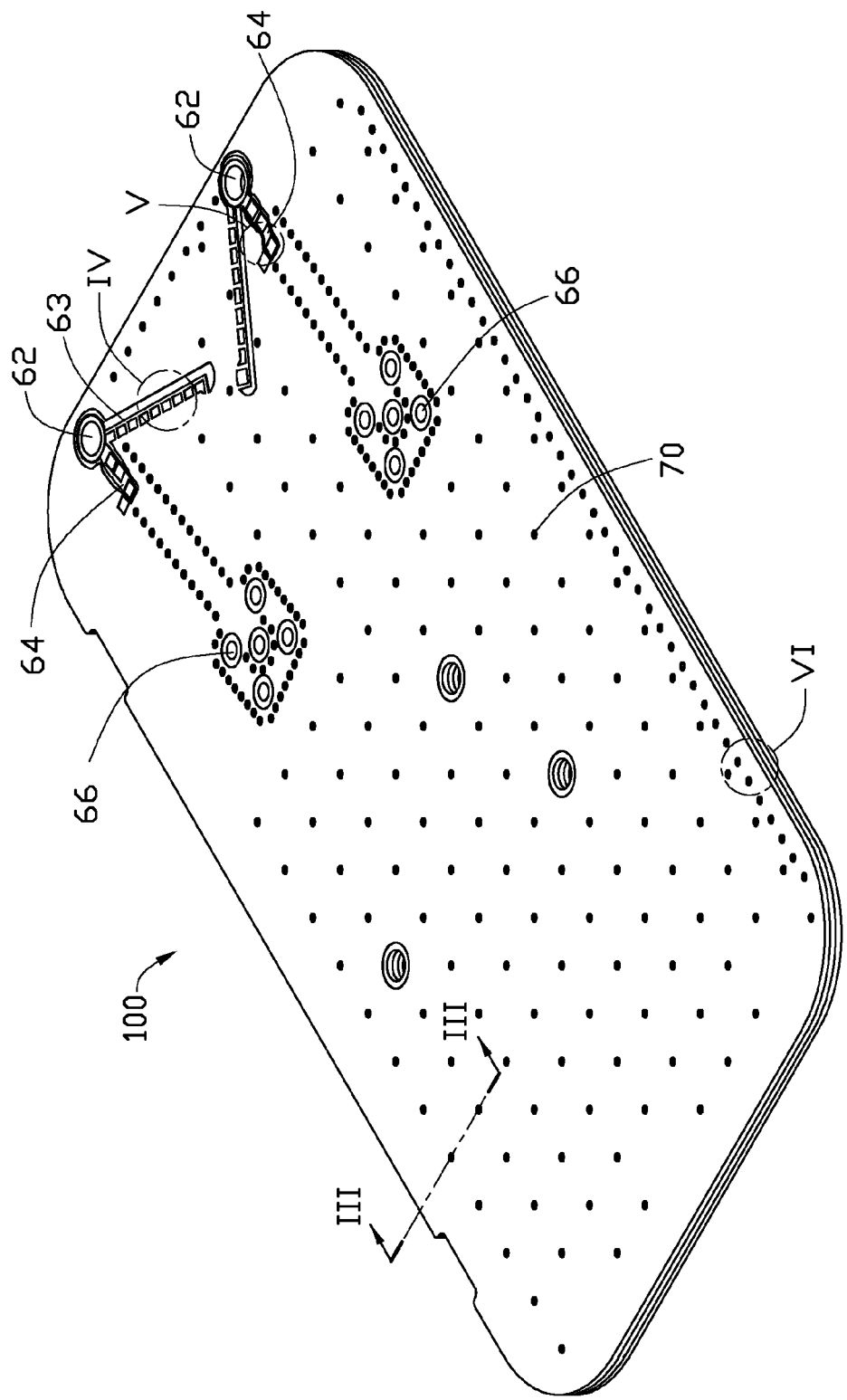
FIG. 1 is a schematic view of a testing circuit board, according to an exemplary embodiment.
Figure 2:
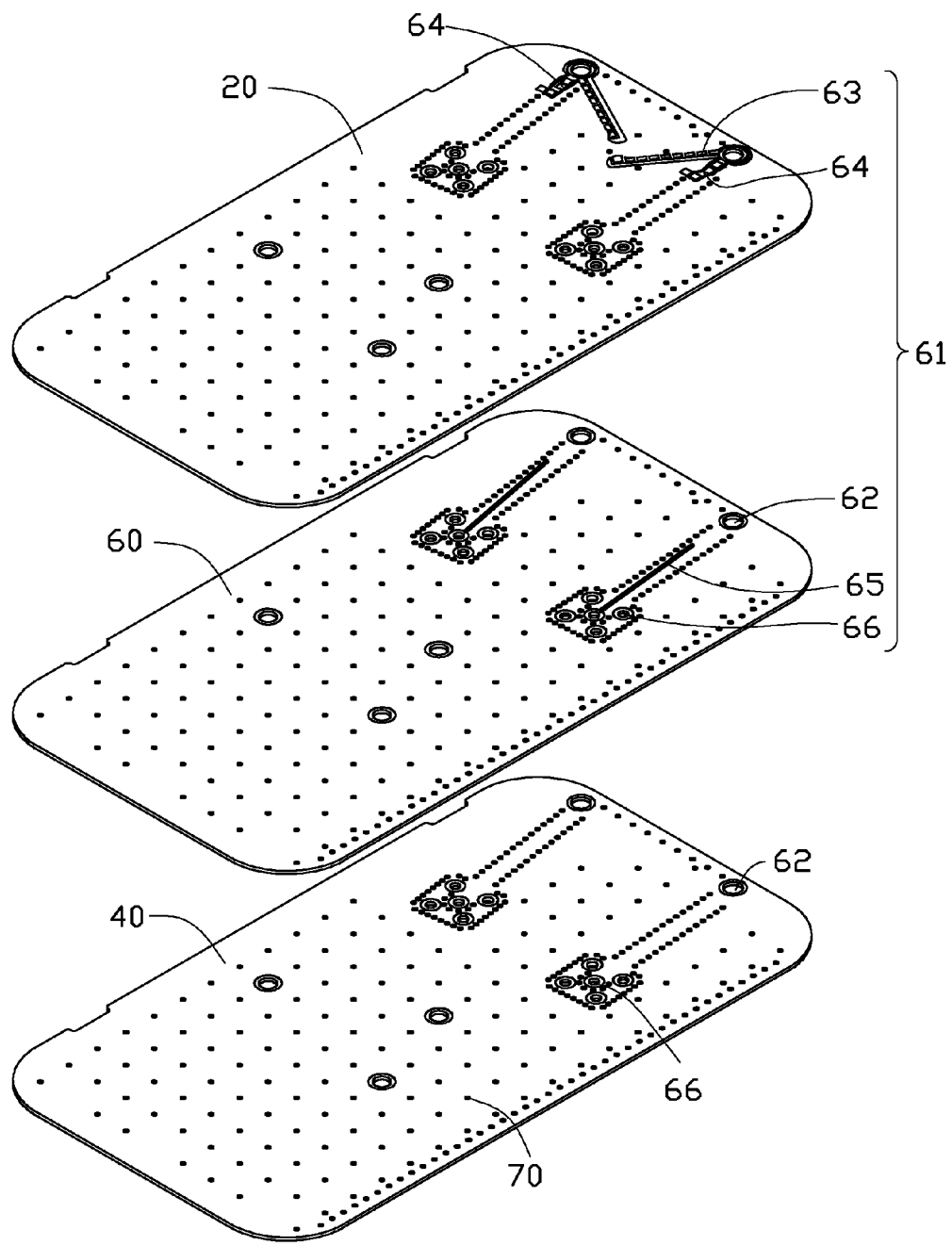
FIG. 2 is an exploded view of the testing circuit board shown in FIG. 1.
Figure 3:
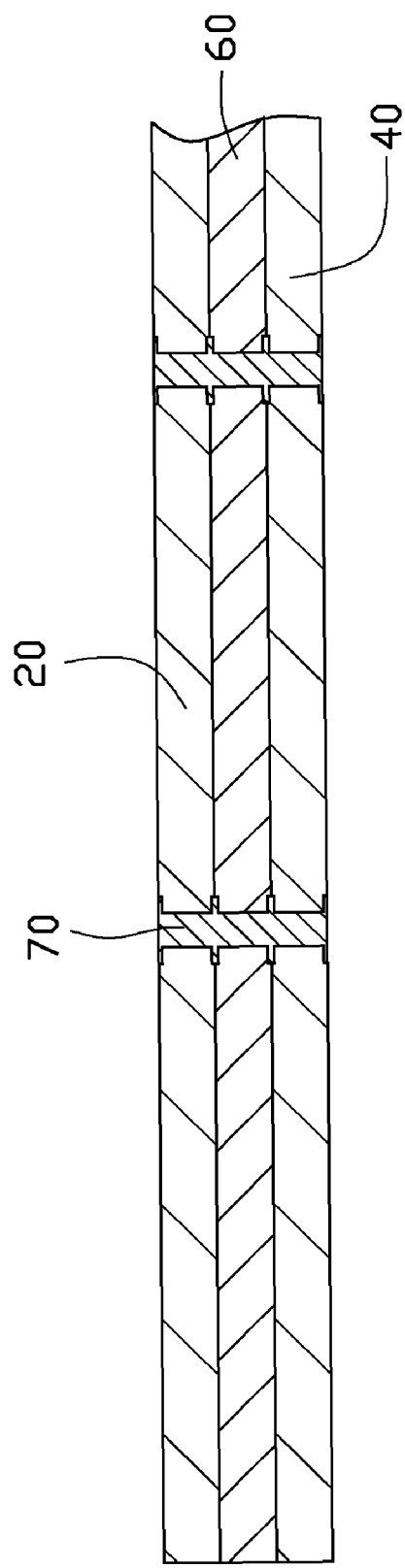
FIG. 3 is a cross-sectional view taken along line of FIG. 1.

FIGS. 1, 2 and 3 show an exemplary embodiment of a testing circuit board 100, which is used for testing antenna performance of an electronic devices, such as a mobile phone, during the production stage. The testing circuit board 100 is sheet-shaped, and can be integrated with a test fixture to test the antenna.

The testing circuit board 100 includes a first base layer 20, a second base layer 40, a signal circuit layer 60, a plurality of test units 61, and a plurality of through holes 70. The signal circuit layer 60 is positioned between the first base layer 20 and the second base layer 40; the through holes 70 pass through the first base layer 20, the second base layer 40 and the signal circuit layer 60.

The first base layer 20, the second base layer 40, and the signal circuit layer 60 are parallel with each other and sheet-shaped, and the first base layer 20 and the second base layer 40 are respectively located on opposite sides of the signal circuit layer 60. The first base layer 20 and the second base layer 40 can be printed wire boards (PWBs), both including metal layers coated with an insulation material. The material of the metal layer can be copper, or silver, etc. The first base layer 20 is for arranging/welding various electronic components and used as a connection interface of the testing circuit board 100 to electrically connect to other devices.

The metal layers of the first base layer 20 and the second base layer 40 are respectively located at opposite sides of the signal circuit layer 60. The metal layers are used as ground sections to protect and shield the test signals transmitted in the signal circuit layer 60 from noise interference, enhancing their electromagnetic susceptibility (EMS). The signal circuit layer 60 can also be a PWB, and includes a metal layer coated with an insulation material. The metal layer of the signal circuit layer 60 can be copper, or silver, used to lay out signal transmission circuit.

Each test unit 61 corresponds to an antenna, such as global position system (GPS) antenna, or Bluetooth antenna. The test unit 61 is electrically connected to a corresponding antenna to receive and transmit the test signals. Each test unit 61 includes a signal inception port 62, a conditioning unit 63, a pad group 64, a signal transmission unit 65, and a signal output port 66.

Each signal inception port 62 is positioned on the signal circuit layer 60 and protrudes from the surface of the first base layer 20. The signal inception ports 62 are located at one end of the testing circuit board 100. The signal inception ports 62 are surrounded by insulated areas, isolated from the surrounding metal layers, so the signal inception ports 62 receive the test signals from the antennas with little noise interference.

Figure 4:
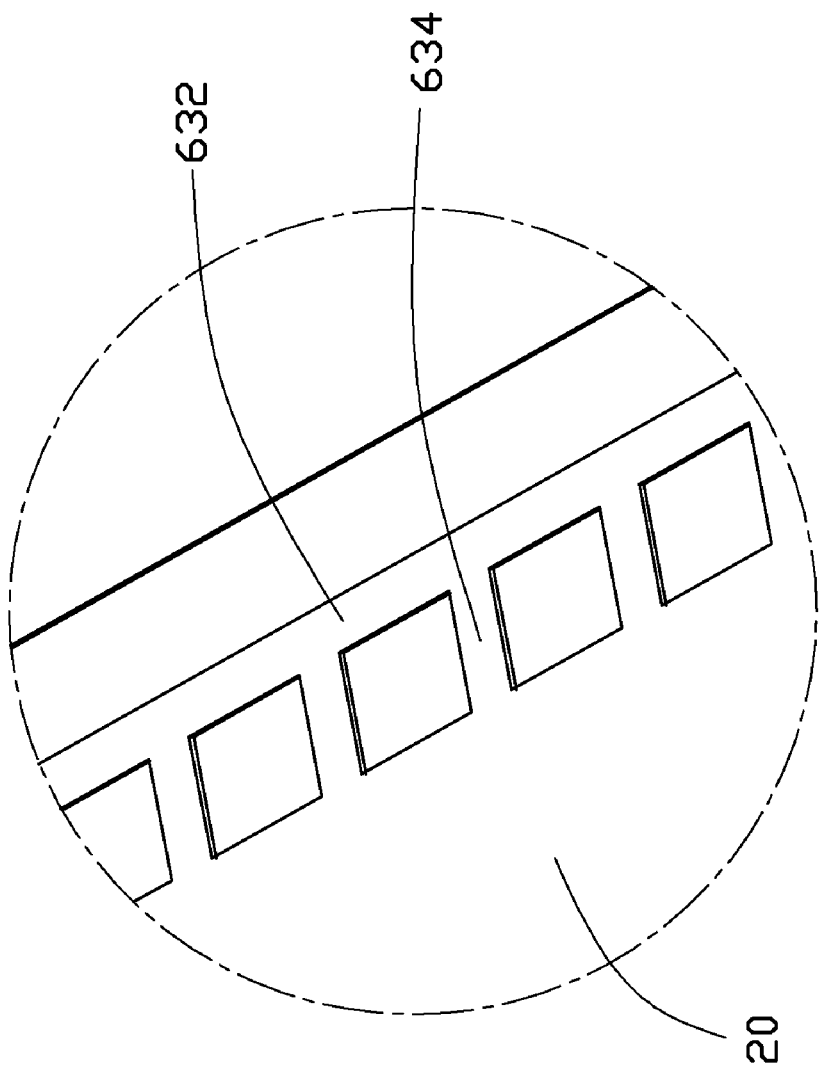
FIG. 4 is an enlarged view of a circled portion IV of a conditioning unit of the testing circuit board shown in FIG. 1.
Figure 5:
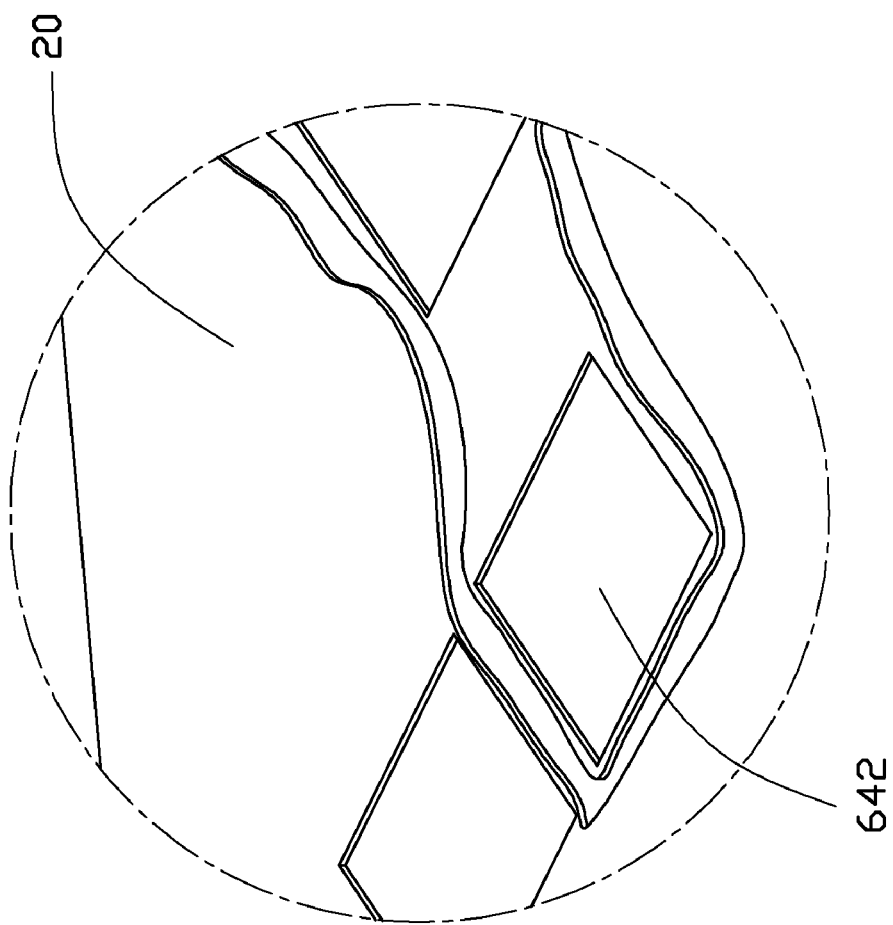
FIG. 5 is an enlarged view of a circled portion V of a pad group of the testing circuit board shown in FIG. 1.

Further referring to FIGS. 4 and 5, each conditioning unit 63 is positioned on the first base layer 20 and adjacent to the corresponding signal inception unit 62. Each conditioning unit 63 includes a connection section 632 and a plurality of micro-strip sections 634. Among them, the connection section 632 is strip shaped and electrically connected to the corresponding signal inception port 62 to receive test signals from the signal inception port 62. The micro-strip sections 634 are connected to the connection section 632 and vertically extend from one side of the connection section 632. Any two micro-strip sections 634 are not connected to each other in the extended direction. In this exemplary embodiment, the connection section 632 and the micro-strip sections 634 can be formed by cutting or etching the metal layer of the first base layer 20.

According to the structural characteristic of the conditioning unit 63, the conditioning unit 63 can adjust the reactance property of the testing circuit board 100, which adjusts the reactance property of the testing circuit board 100 from inductance reactance state to an impedance state or close to an impedance state. The conditioning unit 63 can also reduce the noise interference and stabilize frequency points of the test signals to obtain resonance frequency and return loss of the antenna.

The pad group 64 is positioned on the first base layer 20, and adjacent and electrically connected to the corresponding signal inception port 62. The pad group 64 includes a plurality of pads 642. The pads 642 are to weld chip resistors, chip capacitors, chip inductors or other components to form different matching circuits, which can assist the adjustment reactance property of the testing circuit board 100 to give the frequency points more stability.

The signal transmission unit 65 approximately has a strip shape and is positioned on the signal circuit layer 60. The signal transmission unit 65 is electrically connected to the corresponding pad group 64 located on the first base layer 20 and receives the test signals from the signal inception section 62. In this disclosure, the signal transmission unit 65 can be formed by cutting or etching the metal layer of the signal circuit layer 60. A larger number of through holes 70 are formed around the signal transmission unit 65 to increase the signal shielding effect and reduce noise interference.

Each signal output port 66 is positioned on the signal circuit layer 60 and protrudes from the surface of the first base layer 20. The signal output port 66 is electrically connected to the corresponding signal transmission unit 65 to output the test signals. A number of connectors such as sub-miniature array (SMA) connector are positioned on the first base layer 20 and electrically connect to the signal output port 66, so the test signals are transmitted to network analyzers or other signal processing devices to test the GPS antenna, the BT antenna, or other antennas.

Figure 6:
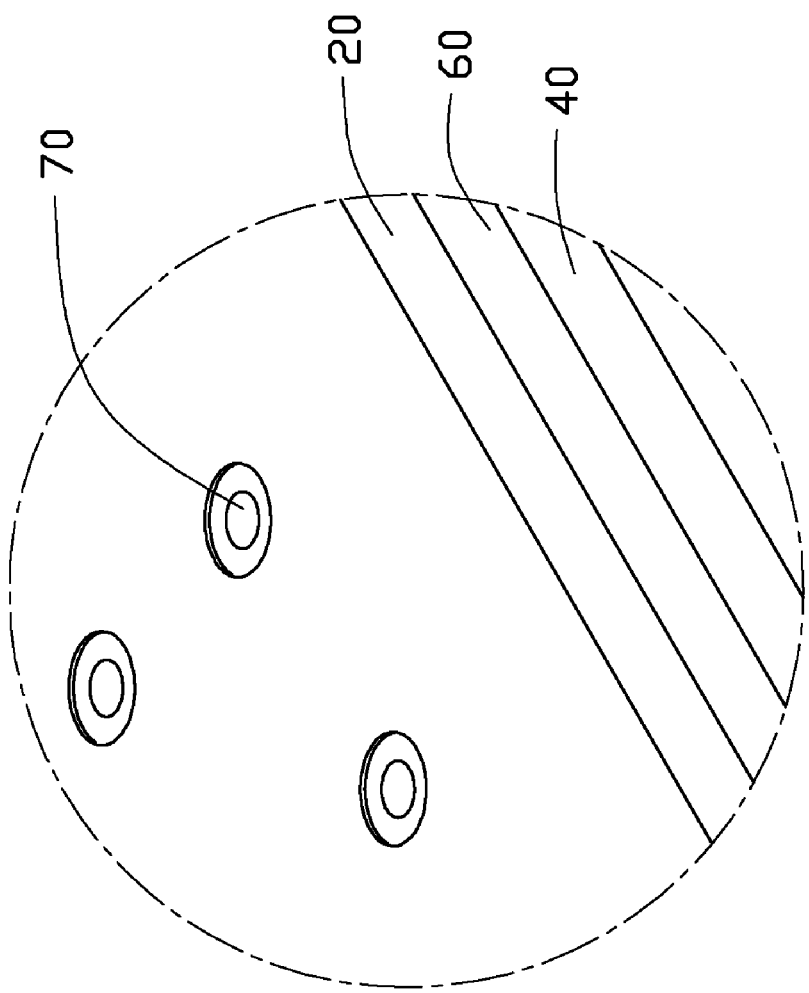
FIG. 6 is an enlarged view of a circled portion VI of the testing circuit board shown in FIG. 1.

Also referring to FIG. 6, the through holes 70 are arranged on the testing circuit board 100 and filled with copper, silver, or other metal material, so the pad group 64 is electrically connected to the signal transmission unit 65 due to the filled metal material. Moreover, the first base layer 20, the second base layer 40, and the signal circuit layer 60 are connected together by the filled metal material. In detail, the metal layers of the first base layer 20, the second base layer 40, and the signal circuit layer 60 are electrically connected with each other to increase ground areas, which can reduce noise interference and enhance EMS.

When the testing circuit board 100 tests any kind of antenna of the portable electronic device, a matching circuit is formed on the pad group 64 to adjust reactance property of the testing circuit board 100, making the frequency points more stable. The signal inception port 62 receives wireless signals as the test signals from the antenna such as the GPS antenna, the BT antenna, and the first base layer 20 and the second base layer 40 shield the test signals to avoid noise interference. The conditioning unit 63 then adjusts the reactance property of the testing circuit board 100, resulting in stabilizing frequency points of the test signals to facilitate test. The signal transmission unit 65 receives the test signals and transmits the test signals to a connector through the signal output port 66, and then the test signals are transmitted to an existing signal processing device such as a network analyzer. Thus, the performance of the antenna is tested by using the testing circuit board 100.

The number of test units 61 can be one for testing a corresponding antenna. Furthermore, the second base board 40 can be omitted, so that the first base board 20 is fixed with the signal circuit layer 60.

In the testing circuit board 100 of the exemplary embodiment, the signal circuit layer 60 is located between the first base layer 20 and second base layer 40 to protect and shield the test signals transmitted to the signal circuit layer 60, causing avoidable noise interference and enhancing EMS. Moreover, the conditioning unit 63 can adjust the reactance property of the testing circuit board 100 and reduce noise interference and stabilize frequency points of the test signals to obtain resonance frequency and return loss of the antenna.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A testing circuit board used for testing an antenna performance, comprising:
    a signal circuit layer for transmitting test signals;
    a base layer connected with the signal circuit layer, the base layer used as a ground section to shield the test signals; and
    a test unit electrically connected to the signal circuit layer and the base layer for testing the antenna, the test unit comprising a signal inception port, wherein the signal inception port is positioned on the signal circuit layer and protrudes from the base layer, and the signal inception port is capable of receiving the test signals and transmitting the test signals to the signal circuit layer.

2. The testing circuit board as claimed in claim 1, wherein the test unit further comprises a conditioning unit, the conditioning unit is positioned on the base layer and adjacent to the signal inception unit.

3. The testing circuit board as claimed in claim 2, wherein the conditioning unit comprises a connection section and a plurality of micro-strip sections, the connection section is electrically connected to the signal inception port to receive the test signals, the micro-strip sections are connected to the connection section and extend from one side of the connection section, and any two micro-strip sections are not connected with each other.

4. The testing circuit board as claimed in claim 2, wherein the test unit further comprises a pad group, the pad group is positioned on the base layer and electrically connected to the signal inception port.

5. The testing circuit board as claimed in claim 4, wherein the pad group comprises a plurality of pads, the pads are capable of welding one or more than one kinds of chip resistors, chip capacitors and chip inductors to form different matching circuits.

6. The testing circuit board as claimed in claim 4, wherein the test unit further comprises a signal transmission unit, the signal transmission unit is positioned on the signal circuit layer, electrically connected to the pad group, and capable of transmitting the test signals.

7. The testing circuit board as claimed in claim 6, wherein the test unit further comprises a signal output port electrically connected to the signal transmission unit, the signal port is positioned on the signal circuit layer and protrudes from the base layer, the signal output port is capable of outputting the test signals to obtain antenna performance.

8. The testing circuit board as claimed in claim 6, wherein the base layer and the signal circuit layer are printed wire boards and respectively comprise a metal layer, the conditioning unit and the signal transmission unit can be formed by cutting or etching the metal layer.

9. The testing circuit board as claimed in claim 8, wherein the testing circuit board defines a plurality of through holes, the through holes pass through the base layer and the signal circuit layer and filled with metal material.

10. The testing circuit board as claimed in claim 9, wherein the pad group is electrically connected to the signal transmission unit due to the filled metal material in the through holes and the metal layers are connected with each other by the filled metal material to increase ground areas.

11. A testing circuit board used for testing an antenna performance, comprising:
    a signal circuit layer for transmitting test signals;
    a first base layer;

a second base layer, the first base layer and the second base layer respectively located on opposite sides of the signal circuit layer and used as ground sections to shield the test signals; and at least one test unit electrically connected to the signal circuit layer, the first base layer and the second base layer for testing the antenna, each test unit comprising a signal inception port, wherein the signal inception port is positioned on the signal circuit layer and protrude from the first base layer, and the signal inception port is capable of receiving the test signals and transmitting the test signals to the signal circuit layer.

12. The testing circuit board as claimed in claim 11, wherein each test unit further comprises a conditioning unit, the conditioning unit is positioned on the first base layer and adjacent to the corresponding signal inception unit.

13. The testing circuit board as claimed in claim 12, wherein the conditioning unit comprises a connection section and a plurality of micro-strip sections, the connection section is electrically connected to the signal inception port to receive the test signals, the micro-strip sections are connected to the connection section and extend from one side of the connection section, and any two micro-strip sections are not connected with each other.

14. The testing circuit board as claimed in claim 12, wherein the test unit further comprises a pad group, the pad group is positioned on the first base layer and electrically connected to the corresponding signal inception port.

15. The testing circuit board as claimed in claim 14, wherein the pad group comprises a plurality of pads, the pads are capable of welding one or more than one kind of chip resistors, chip capacitors and chip inductors to form different matching circuits.

16. The testing circuit board as claimed in claim 14, wherein the test unit further comprises a signal transmission unit, the signal transmission unit is positioned on the signal circuit layer, electrically connected to the pad group, and capable of transmitting the test signals.

17. The testing circuit board as claimed in claim 16, wherein the test unit further comprises a signal output port electrically connected to the signal transmission unit, the signal port is positioned on the signal circuit layer and protrudes from the first base layer, the signal output port is capable of outputting the test signals to obtain antenna performance.

18. The testing circuit board as claimed in claim 16, wherein the first base layer, the second base layer and the signal circuit layer are printed wire boards and respectively comprise a metal layer, the conditioning unit and the signal transmission unit can be formed by cutting or etching the metal layers.

19. The testing circuit board as claimed in claim 18, wherein the testing circuit board defines a plurality of through holes, the through holes pass through the first base layer, the second base layer and the signal circuit layer and filled with metal material.

20. The testing circuit board as claimed in claim 19, wherein the pad group is electrically connected to the signal transmission unit due to the filled metal material in the through holes and the metal layers are electrically connected with each other by the filled metal material to increase ground areas.

* * * * *